United States Patent [19]

Sato

[11] Patent Number: 4,835,740
[45] Date of Patent: May 30, 1989

[54] FLOATING GATE TYPE SEMICONDUCTOR MEMORY DEVICE

[75] Inventor: Masaki Sato, Kawasaki, Japan

[73] Assignee: Kabushiki Kaisha Toshiba, Kawasaki, Japan

[21] Appl. No.: 136,766

[22] Filed: Dec. 22, 1987

[30] Foreign Application Priority Data

Dec. 26, 1986 [JP] Japan .................. 61-308610
May 30, 1987 [JP] Japan .................. 62-136315

[51] Int. Cl.⁴ .................. G11C 11/40; G11C 17/00
[52] U.S. Cl. .................. 365/185; 365/189.09; 357/23.5
[58] Field of Search .................. 365/174, 185, 189; 357/23.5

[56] References Cited

U.S. PATENT DOCUMENTS

| | | | |
|---|---|---|---|
| 4,080,618 | 3/1978 | Tango et al. | 357/23.9 |
| 4,661,833 | 4/1987 | Mizutani | 365/185 X |
| 4,665,418 | 5/1987 | Mizutani | 365/185 X |
| 4,672,409 | 6/1987 | Takei et al. | 365/185 X |
| 4,750,024 | 6/1988 | Schreck | 365/185 X |

OTHER PUBLICATIONS

"Profiled Lightly Doped Drain (PLDD) Structure for High Reliable NMOS-FETs", Symposium on VLSI Technology Digest of Technical Papers (1985), p. 118, Y. Toyoshima et al. (FIG. 2 and lines 19-31 of left--lower portion of p. 118.)

Primary Examiner—James W. Moffitt
Assistant Examiner—Alyssa H. Bowler
Attorney, Agent, or Firm—Oblon, Fisher, Spivak, McClelland & Maier

[57] ABSTRACT

The invention provides a semiconductor memory device including a semiconductor substrate of a first conductivity type, comprising, a gate insulating film on a channel region of the semiconductor substrate, a floating gate on the gate insulating film, a floating gate insulating film on the floating gate, a control gate on the floating gate insulating film, first and second impurity regions of a second conductivity type in the semiconductor substrate and being adjacent to the gate insulating film, a third impurity region of the second conductivity type more lightly doped than the first and second impurity regions, being adjacent to the channel region, and a fourth impurity region of the second conductivity type more highly doped than the third impurity region and more lightly doped then the first and second impurity regions in the surface region of the third impurity region.

2 Claims, 4 Drawing Sheets

FLOATING GATE TYPE SEMICONDUCTOR MEMORY DEVICE

BACKGROUND OF THE INVENTION

1. Field of the Invention

This invention relates to semiconductor memory devices and to a method of manufacturing the same. In particular, it relates to non-volatile semiconductor memories having a floating gate and control gate and to a method of forming the same.

2. Description of the Related Art

To write data into an EPROM memory cell, the control gate is given a high positive voltage to form a channel in the substrate surface, and a positive voltage is applied to the drain. When this is done, the electrons running in the channel receive high energy from the high electric field that is generated in particular in the neighbourhood of the drain, with the result that they cross the energy barrier of the insulating film and are injected into the floating gate. Thus the condition in which electrons are injected into the floating gate is the write condition.

However, when, to reduce the size of the EPROM cell, the channel length L is shortened, a high electric field is generated in the vicinity of the drain, not only on applying high voltage in a write operation as described above, but even on executing a read operation, for which a comparatively low voltage is used. Such generation of high electric field during a read operation causes change of the amount of stored charges in the floating gate of the memory cell, which may even destroy the stored data.

In an attempt to avoid such spurious operation occurring when there is a read operation, the memory cell construction shown in FIG. 1 could be considered, for example.

In this Figure, reference numeral 111 designates a P type silicon substrate, reference numerals 112 and 113 designate N+ diffusion layers constituting a source and drain, respectively. Reference number 114 designates a gate insulating film. Reference numeral 115 designates a floating gate, 116 is a control gate, 117 is a source electrode, and 118 is a drain electrode.

In a semiconductor memory device constructed as above, N− diffusion layers 121 and 131 are respectively formed adjacent the respective channel formation regions of N+ diffusion layers 112 and 113 constituting the source and drain.

Thus, formation of N− diffusion layer 131 reduces the electric field in the drain region so that the aforementioned type of spurious operation could be prevented from occurring when a read operation takes place. However, such a cell construction using a lightly doped region (N− diffusion region 131) is subject to a serious drawback, in that it has a poor write characteristic. The reason for this is that, since the drain electric field is lowered by N− diffusion layer 131, the electrons running in the channel region cannot be given sufficient energy, so the efficiency with which they are injected into floating gate 115 is diminished.

SUMMARY OF THE INVENTION

The object of this invention is to provide a semiconductor memory device and method for manufacturing it wherein the spurious operation during read operation in a memory cell having a floating gate is prevented and an improvement is made in respect of the problem of deterioration of its write characteristic.

According to a first aspect of the present invention there is provided a semiconductor memory device including a semiconductor substrate of a first conductive type, comprising a gate insulating film on a channel region of the semiconductor substrate, a floating gate on the gate insulating film, an insulating film on the floating gate, a control gate on the floating gate insulating film, first and second impurity regions of a second conductive type in the semiconductor substrate and being adjacent to the gate insulating film, a third impurity region of the second conductive type more lightly doped than the first and second impurity regions, being adjacent to the channel region, and a fourth impurity region of the second conductive type more highly doped than the third impurity region and more lightly doped than the first and second impurity regions in the surface region of the third impurity region.

This invention preferably provides a semiconductor memory device further comprises a fifth impurity region of the first conductive type more highly doped than the semiconductor substrate, being deeper from the surface of the semiconductor substrate than the third impurity region.

According to a second aspect of the present invention there is provided a method of manufacturing a semiconductor memory device having a semiconductor substrate of a first conductive type comprising the steps of, (a) forming a gate insulation layer on the semiconductor substrate, (b) depositing a first gate pattern on the gate insulation layer to form a floating gate, (c) implanting ions of the second conductive type into the substrate, using the gate pattern as a mask, (d) implanting ions of the second conductivity type in a dose different from the ion implanting of the step (c) into the substrate using the gate pattern as a mask, (e) forming a silicon oxide film on the side face portions of the floating gate; and (f) implanting ions of the second conductivity type into the substrate using the gate pattern as a mask after the step (e).

With a semiconductor memory cell having the impurity distribution described above, during read operation, because of the presence of the lightly doped region, the drain electric field is lower, and the channel current flows through the lightly doped region, so that the efficiency of injection of electrons into the floating gate is increased, with the result that the rate of spurious writing is lowered. Furthermore, in writing operation, wherein high voltage is applied to the drain and control gates, a high drain electric field is generated in the highly doped region adjacent the drain, so the channel current passes through the highly doped region, decreasing generation of hot carriers. Moreover, because of the presence of a highly doped region of the same conductivity type as the substrate, occurrence of channel pass in the deeper parts of the channel region between source and drain when high voltage is applied to the drain can be suppressed, so a high electric voltage can easily be applied to the drain.

Consequently, spurious operation on read operatio can be prevented yet a semiconductor with good write characteristics can be obtained.

BRIEF DESCRIPTION OF THE DRAWINGS

Embodiments of the invention will now be described by way of example only and with reference to the accompanying drawings, in which.

DETAILED DESCRIPTION OF THE PREFERRED EMBODIMENTS

Figure 1:
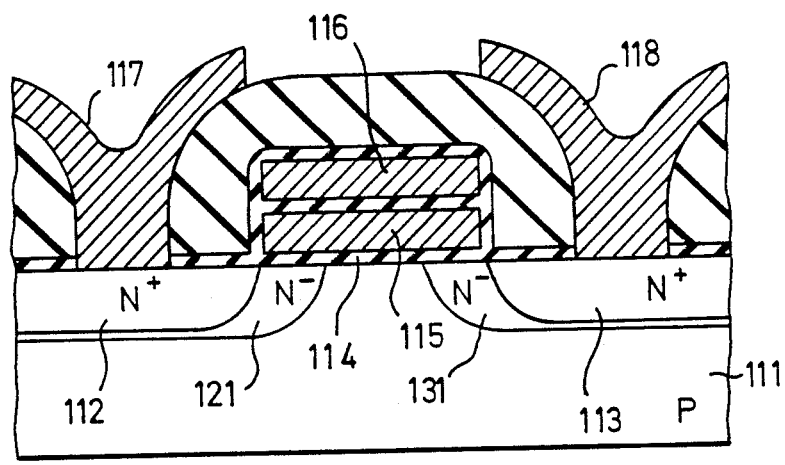
FIG. 1 is a cross-sectional view given in explanation of a semiconductor memory device.

The case where this invention is applied to an N channel EPROM will now be described with reference to FIG. 2 of the drawing.

Figure 2:
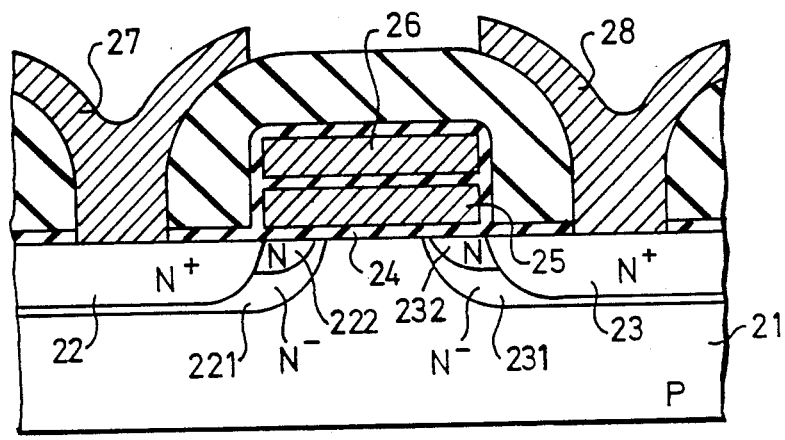
FIG. 2 is a cross-sectional view given in explanation of a semiconductor memory device according to an embodiment of this invention.

FIG. 2 is a cross-sectional view of an EPROM according to an embodiment of this invention. In the drawing, N+ diffusion layers 22 and 23 of impurity concentration for example $1 \times 10^{20}$ [cm$^{-3}$] are formed in the surface region of a P type silicon substrate 21 with a separation between them, respectively. N− diffusion layers 221 and 231 of impurity concentration for example $1 \times 10^{18}$ [cm$^{-3}$] are formed adjacent the channel regions of N+ diffusion layers 22 and 23, respectively. N type diffusion layers 222 and 232 of impurity concentration for example $1 \times 10^{19}$ [cm$^{-3}$] are formed in the surface region of N− diffusion layers 221, 231, respectively.

That is, the source region is formed by N+ diffusion layer 22 and N− diffusion layer 221 and N type diffusion layer 222, and the drain region is formed by N+ diffusion layer 23 and N− diffusion layer 231 and N type diffusion layer 232.

Reference numeral 24 designates the gate insulating film, 25 is the floating gate, 26 is the control gate. Reference numerals 27 and 28 refer to the source electrode and the drain electrode, respectively.

In an EPROM memory cell of the above construction, when a read operation is performed by applying 5[V] to control gate 26 and applying 1.5 [V] to drain electrode 28, the path of the current flow is separated from the surface of substrate 21, so that the current mainly flows through N− diffusion layer 231 that reduces the generation of an electric field. Consequently, just as in the case of the memory cell of FIG. 1, spurious injection of electrons into floating gate 25 can be prevented.

When a write operation is performed by applying high voltage to control gate 26 and applying 7[V] to drain electrode 28, the path of the current flow shifts towards the gate electrodes (floating gate 25, control gate 26), so that the current mainly flows through N type diffusion layer 232 that is formed in the surface region of N− diffusion layer 231. Since this N type diffusion layer 232 is more highly doped than N− diffusion layer 231, the electrons running in the channel receive high energy due to the high electric field created by this N type diffusion layer 232, which allows them to be injected into floating gate 25. Consequently, the speed of this write operation is very much faster than that of the EPROM cell shown in FIG. 1.

In this embodiment, the impurity concentration of N type diffusion layer 232 is set between that of diffusion layer 23 and N diffusion layer 232, it could be about the same as the impurity concentration of the N+ diffusion layer 23.

The source region need not of course necessarily have the construction described above.

As described above, with this invention, even though spurious operation on read operation is prevented, sufficient writing speed is still obtained. Consequently, reduction in the size of the memory cells can be achieved whilst maintaining good read and write characteristics.

A further embodiment of the invention is described in detail below with reference to FIGS. 3, 4 and 5 of the drawings, for the case wherein an embodiment of the invention is applied to an N-channel EPROM.

Figure 3:
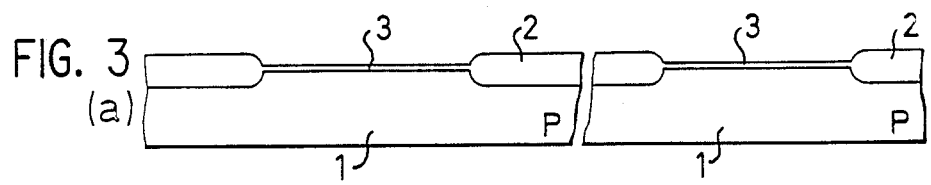
FIG. 3(*1*) to (*g*) are views showing part of a wafer cross-section in the various steps relating to a further embodiment of the method for manufacturing a semiconductor memory device of this invention.
Figure 3:
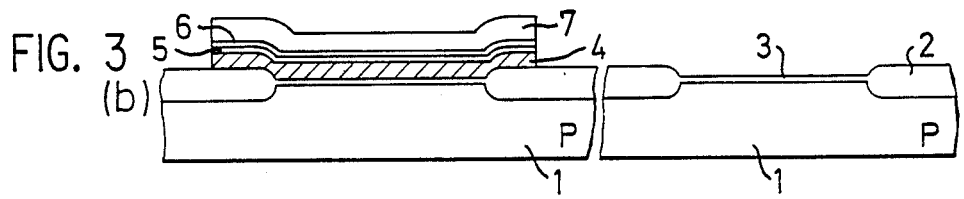
Figure 3:
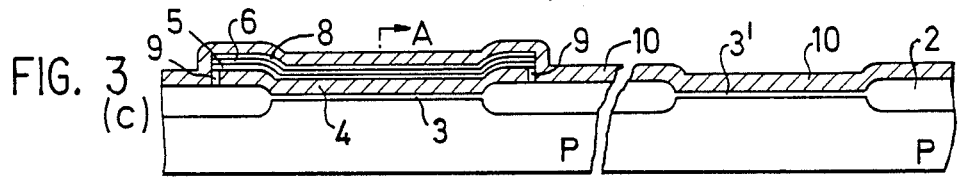
Figure 3:
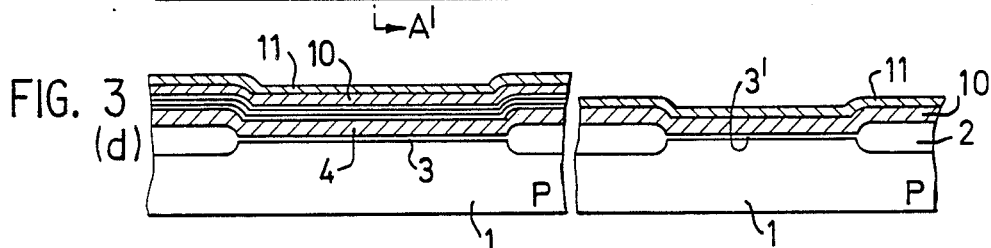
Figure 3:
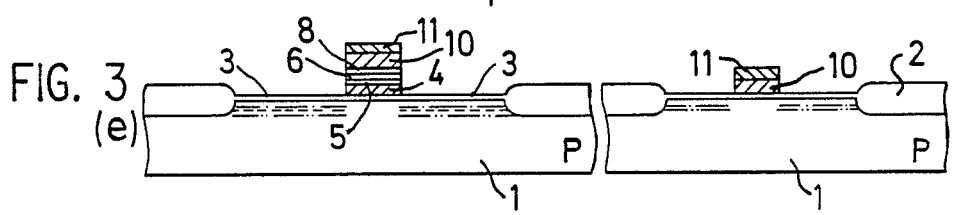
Figure 3:
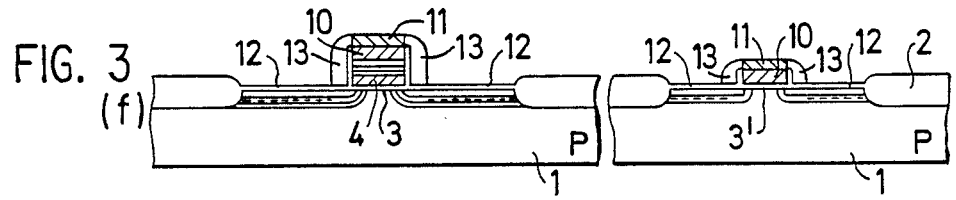
Figure 3:
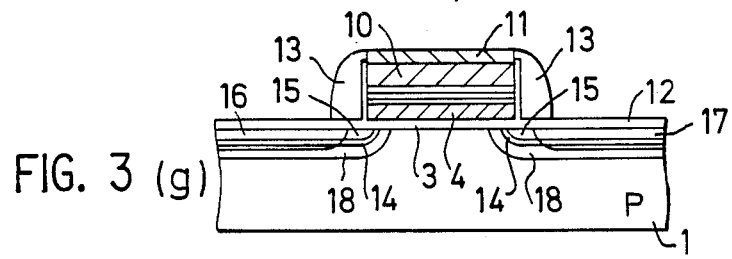

FIG. 3(*a*) to (*g*) show a partial cross-sectional view of the construction of a semiconductor wafer in the process of manufacturing an EPROM. In this manufacturing process, first of all, as shown in FIG. 3(*a*), required element isolating regions 2 are formed on semiconductor substrate 1 by the usual field isolation technique, and a gate insulating film 3 is formed on the substrate. Next, as shown in FIG. 3(*b*), after carrying out ion implantation for controlling the threshold voltage of the cell in the desired predetermined cell regions, a first polysilicon film 4 is formed on the whole surface of the substrate by the LPCVD (low pressure chemical vapour growth deposition) to a thickness of 2000 Angstrom ($2 \times 10^{-7}$m), and a silicon oxide film 5 is formed by thermal oxidation of this polysilicon film 4 to a thickness of 150 Angstrom ($1.5 \times 10^{-8}$m). Additionally, a silicon nitride film 6 is formed to a thickness of 150 Angstrom ($1.5 \times 10^{-8}$m) by the LPCVD, then the desired resist pattern 7 to form the floating gate of the EPROM cell (memory cell) is formed. Silicon nitride film 6, silicon oxide film 5, and first polysilicon film 4 is then etched using this resist pattern 7 as a mask. In this process, the cross-sectional construction of a memory cell region for memory cell formation is typically represented by the left side portion of FIG. 3(*b*) and the cross-sectional construction of the peripheral region for forming the memory peripheral circuitry is represented by the right side portion of FIG. 3(*b*). As shown in this Figure, first polysilicon film 4, silicon oxide film 5, and silicon nitride film 6, are respectively removed. Next, resist pattern 7 is removed, and depending on the type of MIS FET (insulating gate type field effect transistor) used in the peripheral circuitry, the desired impurity ions for controlling the threshold voltage are implanted. Gate oxide film 3 is then removed in the peripheral region, and substrate 1 is cleaned. Next, the whole substrate is thermally oxidized, so that, as shown in FIG. 3(*c*), a silicon oxide film 3′ of thickness 300 Angstrom ($3 \times 10^{-8}$m) is formed on the substrate. At the same time, a silicon oxide film 8 is formed in a thickness of 10 to 15 Angstrom (1 to $1.5 \times 10^{-9}$m) on silicon nitride film 6, the film 6 being formed on first polysilicon film 4 in the memory cell regions. The oxidation also forms a silicon oxide film 9 on the side face portion of first polysilicon film 4. Next, a second polysilicon film 10 is formed on the whole surface of the substrate to a thickness of 3000 Angstrom ($3 \times 10^{-7}$m) by the LPCVD. Next, as shown in FIG. 3(d), an oxynitride film 11 is formed in a thickness of 1000 Angstrom ($1 \times 10^{-7}$) on second polysilicon film 10 by the LPCVD method. The treatment conditions for this are as follows: degree of vacuum 200 Pa, reaction gas $SiH_2Cl_2$, $N_2O$, $NH_3$ supplied in flow ratios of 100 to 250 to 500, temperature: 800 degrees C. The cross-section of the memory cell region shown in FIG. 3(d), (that is, the left hand portion of the figure) is a cross-section along the line A-A' of FIG. 3(c), but the right hand portion of FIG. 3(d) corresponds directly to the right hand portion of FIG. 3(c). Next, a required resist pattern (not shown) is formed using the known photo lithography technique, and the resist pattern for the word lines of the memory cell regions and the resist pattern for the polysilicon gates of the peripheral circuitry FETs are formed at the same time. Oxynitride film 11, second polysilicon film 10, silicon oxide film 8, silicon nitride film 6 and silicon oxide film 5 are selectively etched using these resist patterns as a mask, as shown in FIG 3(e). Next, this resist pattern is removed, and the substrate is cleaned, then the peripheral region is covered with resist, and using oxynitride film 11 as a mask, first polysilicon film 4 is selectively etched in the memory cell regions. In this way, the memory cell region word lines (control gates), consisting of this second polysilicon film 10, and peripheral region and gate electrodes and the memory cell region floating gates consisting of first polysilicon film 4 are formed. Next, using as a mask these control gates and floating gate 4, boron (B) ions are implanted in the memory cell region in a dose of $5 \times 10^{12} cm^{-2}$, using an 80 keV accelerating voltage. After this, arsenic (As) ions are implanted in a dose of $2 \times 10^{14} cm^{-2}$, using a 40 keV accelerating voltage. Then arsenic (As) ions are implanted in a dose of $1 \times 10^{13} cm^{-2}$, using a 50 keV accelerating voltage. During this process, ion implantation can also be carried out, in the same way as in this memory cell region, in the peripheral N channel MOS FET formation region. Next, first and second polysilicon films 10 and 4 are etched, then the exposed silicon oxide film 3,3' is removed and the whole surface of the substrate is cleaned. Next, as shown in FIG. 3(f), a silicon oxide film 12 is formed in an $O_2$ atmosphere at 950 degrees C over the silicon substrate surface to a thickness of 300 Angstrom ($3 \times 10^{-8}$m). Then this silicon oxide film 12 is etched by anisotropic dry etching, so that a silicon oxide film 13 is left behind on the side portions of the polysilicon pattern. Next, the substrate is washed, and arsenic ions (or phosphorus ions) are implanted in a dose of $5 \times 10^{15} cm^{-2}$ at 40 keV in the source regions and drain regions of the peripheral region N channel MOS FETs and in the source regions and drain regions of the memory cell transistors. After this, an $SiO_2$ film is formed to a thickness of 3000 Angstrom ($3 \times 10^{-7}$m) by the CVD (Chemical Vapour Deposition) over the whole substrate, to serve as a covering insulating film, and a PSG (phosphor silicate glass) film is formed to a thickness of 10,000 Angstrom ($1 \times 10^{-6}$m), and annealed for 30 minutes at 950 degrees C to activate it. The electrode wiring contact holes are then formed and formation of the EPROM is completed by forming the required aluminium wiring. The cross-sectional construction of an EPROM cell in an EPROM formed in this way is shown in FIG. 3(g).

Specifically, two superposed $N^-$ diffusion layers 14 and 15 of different type, or different depth of diffusion and different degree of doping are formed in the substrate below the edge of floating gate 4 on the drain and below the edge of floating gate 4 on the source side. These $N^-$ diffusion layers 14 and 15 are of a lower degree of doping than the $N^+$ diffusion layers 16 and 17 of the source and drain regions and are respectively in contact with these source and drain regions. In this case, the upper (nearest the surface of the substrate) $N^-$ diffusion layer 15 is more heavily doped than the lower $N^-$ diffusion layer 14. In addition, a $P^+$ diffusion layer 18 is formed in contact with the channel region of these $N^-$ diffusion layers 14 and 15.

Figure 4A:
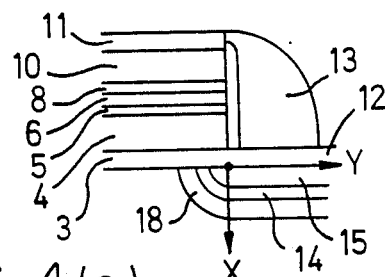
FIG. 4(*a*), (*b*), and (*c*) are views showing the distribution of the impurity concentration in the direction of the depth of the substrate below the gate edge of the drain in the memory cell of FIG. 3(*g*) and along the direction of the substrate surface.
Figure 4B:
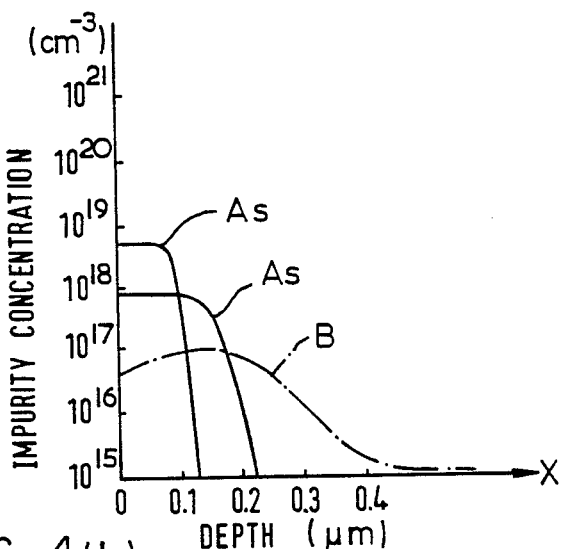
Figure 4C:
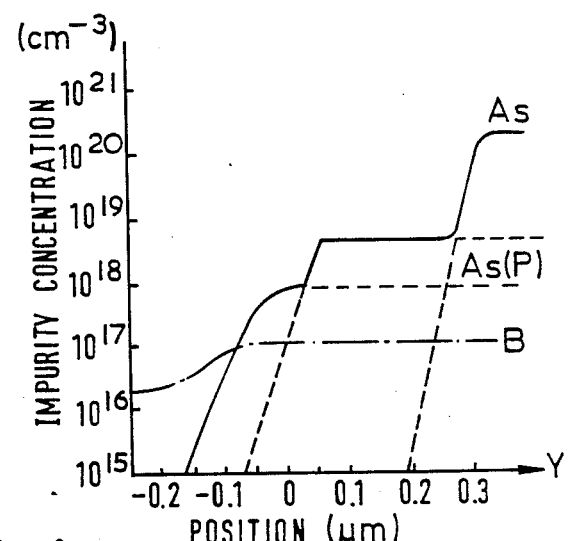
Figure 5:
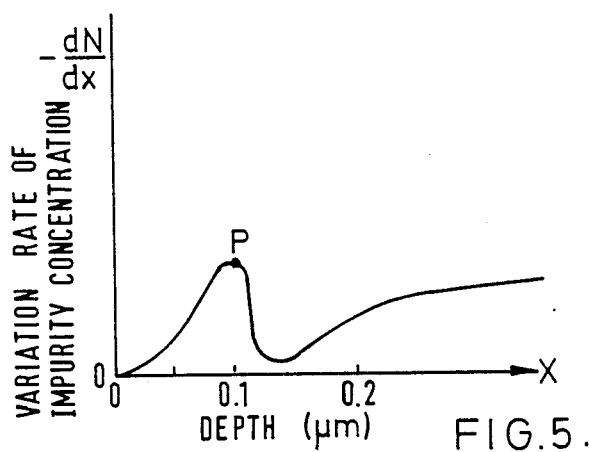
FIG. 5 is a view showing the rate of variation of concentration of N type impurity of FIG. 4(*a*)

In the above construction, if the depth of the substrate is represented by X and the horizontal position along the substrate surface is represented by Y, as shown in FIG. 4(a), the typical impurity distribution below the gate edge on the drain side is as shown in FIG. 4(b) for the depth direction and as shown in FIG. 4(c) for the horizontal direction. As shown in FIG. 5, the rate of variation of the N type impurity in this depth direction has a characteristic that gradually increases as the substrate depth is increased, and has a maximum value P at a certain depth. An in FIGS. 4(b) and 4(c), the P type impurity (boron) shows a distribution wherein its concentration falls as the substrate depth increases, and the concentration falls from the drain going in the direction of the channel.

With an EPROM cell constructed as above, since a $P^+$ diffusion layer 18 of high degree of doping is formed between drain 17 and the channel region (FIG. 4a), "punch-through" i.e. electrons flowing into the deeper parts of the substrate, can scarcely occur, even when a high drain voltage is applied. Consequently, a high voltage can be applied to the drain during writing, making it possible to use a high drain electric field, so that the efficiency of injection of electrons into floating gate 4 can be increased. Additionally, an $N^-$ diffusion layer 15 of somewhat higher degree of doping than lightly doped $N^-$ diffusion layer 14 is present on the channel side of the source and drain, on the inside of this lightly doped $N^-$ diffusion layer 14. Because of this layer, during read operation with low gate voltage, the effect from the gate potential at the gate edge is weakened, and falls off in the depth direction of the substrate at the location of this lightly doped $N^-$ diffusion layer 14, with the result that the electrons running through the channel pass through this $N^-$ diffusion layer 14. Consequently, not only is the drain electric field lowered, but also generation of hot electrons in the deeper locations of the substrate is increased, so the rate of arrival of electrons at floating gate 4 is reduced. In contrast, during a writing operation, a high gate voltage is applied, so the electrons running through the channel are more strongly affected by the gate potential below the gate edge, so they continue flowing along the substrate surface, passing through heavily doped $N^-$ diffusion layer 15. Consequently, the electrons pass through the high field portions, and the location where hot electrons are generated shifts more towards the surface. The efficiency of injection of electrons into floating gate 4 is increased, and the write characteristic is improved.

Also, with the method of manufacture as described above, an EPROM cell having an effect as described above can be realized by a combination of existing manufacturing techniques. Furthermore, since, in the step shown in FIG. 3(e), oxynitride film 11 is used as a mask in selectively etching first polysilicon film 4, there is the advantage that workability is improved since it becomes possible to reduce the extent of side etching of this polysilicon film 4 compared with the case where for example as $SiO_2$ film is used as a mask.

Figure 6:
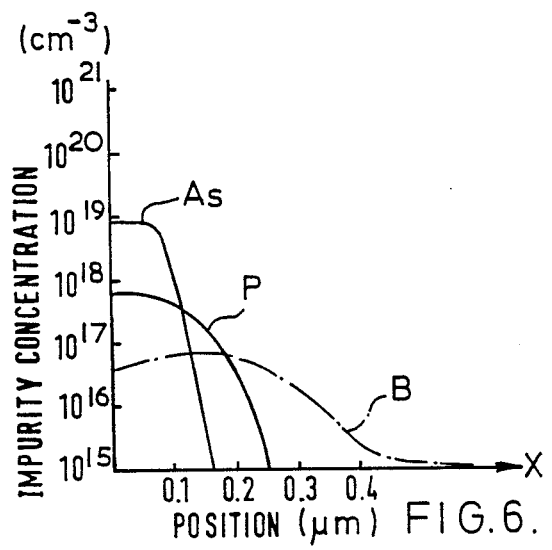
FIG. 6 is a view showing the distribution of the impurity concentration in the direction of the depth of the substrate below the gate edge of the drain in the cell of FIG. 7.
Figure 7:
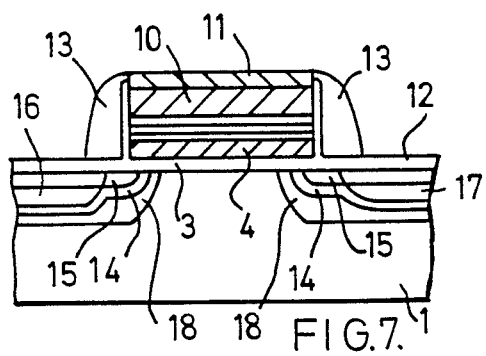
FIG. 7 is a cross-sectioal view showing a memory cell according to another embodiment of this invention.

The invention is not restricted to the above described embodiment. In the above embodiment, formation of $N^-$ diffusion layers 14 and 15 is performed by implantation of arsenic ions but it could be carried out by phosphorous (P) and arsenic ion implantation. In this case, the typical impurity distribution below the gate edge on the drain side is as shown in FIG. 6 for the X direction and the same as shown in FIG. 4(c) for the Y direction. In this case, the cross-sectional structure of the EPROM cell is as shown in FIG. 7. The depth relationship of $N^-$ diffusion layer 14 and $N^+$ diffusion layers 16 and 17 and the distribution of impurity in the depth direction below the gate edge are somewhat different from what they are in the above described embodiment shown in FIG. 3(g), but other portions are the same, and so are given the same reference numerals.

Figure 8:
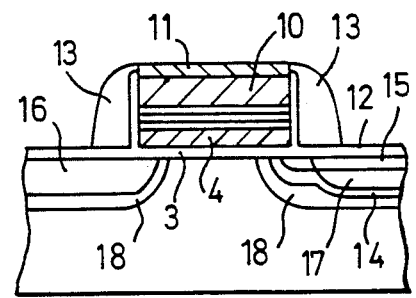
FIG. 8 is a cross-sectional view showing a memory cell according to yet a further embodiment of this invention.

Also in the above embodiment $N^-$ diffusion layers 14 and 15 are respectively provided on the drain side and the source side, but they can be provided on the drain side only, as shown in FIG. 8. In this case, in the manufacturing step, a further mask is added before $SiO_2$ film 13 produced by the CVD method is formed at the side of the polysilicon pattern for floating gate 4. Thus it becomes possible to implement them by arsenic ion implantation in the high dose of 40 keV, $2 \times 10^{15} cm^{-2}$, for example, carried out only on the source side of the memory cell region. With such an EPROM cell construction, there is the advantage that $N^-$ diffusion layers 14 and 15 are not present on the source side, so the parastic resistance due to these is reduced, and memory cell current is increased. Furthermore, during writing and reading, the source and drain can be used inversely (i.e. the $N^+$ diffusion layer 16 on the source side can be used as a drain during writing and the $N^+$ diffusion layer 17 of the drain side that is provided with $N^-$ diffusion layers 14,15 can be used as a drain during reading), thereby improving the reliability of the EPROM cell.

Moreover, the non-volatile semiconductor memory of this invention can be applied not just to memory integrated circuits but also to on-chip memories such as memory mixed devices, and can of course be applied generally to $E^2PROMs$ and not just to EPROMs.

As described above, according to this invention, spurious operation when reading can be prevented, and during writing operation increasing hot carriers and occurrence of channel pass in the deeper parts of the channel region can be suppressed, thereby enabling a semiconductor memory device of good writing characteristics to be provided, as well as a method for manufacturing it.

Various modifications can be made to the above described embodiments without departing from the scope of the invention.

What is claimed is:

1. A semiconductor memory device including a semiconductor substrate of a first conductivity type, comprising:
   a gate insulating film on a channel region of the semiconductor substrate;
   a floating gate on the gate insulating film;
   a floating gate insulating film on the floating gate;
   a control gate on the floating gate insulating film;
   first and second impurity regions of a second conductivity type in the semiconductor substrate and being adjacent to the gate insulating film;
   a third impurity region of the second conductivity type more lightly doped than the first and second impurity regions, being adjacent to the channel region; and
   a fourth impurity region of the second conductivity type more highly doped than the third impurity regio and more lightly doped than the first and second impurity regions, being in the surface region of the third impurity region.

2. The semiconductor memory device as claimed in claim 1, wherein the semiconductor memory device comprises a fifth impurity region of the first conductivity type more highly doped than the semiconductor substrate and being deeper from the surface of the semiconductor substrate than the third impurity region.

* * * * *